(12) United States Patent
Higashi et al.

(10) Patent No.: US 10,452,217 B2
(45) Date of Patent: Oct. 22, 2019

(54) CONDUCTIVE FILM, TOUCH PANEL SENSOR, AND TOUCH PANEL

(71) Applicant: FUJIFILM Corporation, Tokyo (JP)

(72) Inventors: Kohei Higashi, Kanagawa (JP); Naoki Tsukamoto, Kanagawa (JP); Masataka Satou, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 78 days.

(21) Appl. No.: 15/797,885

(22) Filed: Oct. 30, 2017

(65) Prior Publication Data

US 2018/0046284 A1 Feb. 15, 2018

Related U.S. Application Data

(63) Continuation of application No. PCT/JP2016/065628, filed on May 26, 2016.

(30) Foreign Application Priority Data

May 29, 2015 (JP) .................................. 2015-110717

(51) Int. Cl.
*G06F 3/044* (2006.01)
*B32B 15/08* (2006.01)
(Continued)

(52) U.S. Cl.
CPC .............. *G06F 3/044* (2013.01); *B32B 5/028* (2013.01); *B32B 15/04* (2013.01); *B32B 15/08* (2013.01);
(Continued)

(58) Field of Classification Search
CPC .............. B32B 15/08; B32B 2307/202; B32B 2457/208; B32B 15/04; B32B 5/028;
(Continued)

(56) References Cited

U.S. PATENT DOCUMENTS

2010/0080964 A1 4/2010 Kano et al.
2013/0168138 A1* 7/2013 Yamazaki ............... G06F 3/041
174/253

FOREIGN PATENT DOCUMENTS

JP 2002-223095 A 8/2002
JP 2004-221565 A 8/2004
(Continued)

OTHER PUBLICATIONS

International Search Report issued in PCT/JP2016/065628; dated Aug. 16, 2016.
(Continued)

*Primary Examiner* — Charles V Hicks
(74) *Attorney, Agent, or Firm* — Studebaker & Brackett PC

(57) ABSTRACT

According to the invention, there are provided a conductive film which has a mesh-like metal layer composed of metal thin wires and in which visual recognition of the metal thin wires is suppressed and the metal layer has excellent conductive characteristics, a touch panel sensor, and a touch panel. A conductive film according to the invention includes a substrate; a patterned to-be-plated layer which is disposed on the substrate in a mesh pattern and has a functional group interacting with a plating catalyst or a precursor thereof; and a mesh-like metal layer which is disposed on the patterned to-be-plated layer and has a plurality of metal thin wires intersecting each other, an average thickness of the patterned to-be-plated layer is 0.05 to 100 μm, an average thickness of the metal layer is 0.05 to 0.5 μm, and an average intersection growing rate at an intersection of metal thin wires of the mesh of the metal layer is 1.6 or less.

15 Claims, 5 Drawing Sheets

(51) Int. Cl.
*C23C 18/30* (2006.01)
*C23C 18/31* (2006.01)
*B32B 5/02* (2006.01)
*B32B 15/04* (2006.01)
*H05K 1/02* (2006.01)
*H05K 3/18* (2006.01)
*C23C 18/16* (2006.01)
*C23C 18/20* (2006.01)
*C23C 18/38* (2006.01)
*C23C 18/54* (2006.01)

(52) U.S. Cl.
CPC ...... *C23C 18/1605* (2013.01); *C23C 18/2086* (2013.01); *C23C 18/30* (2013.01); *C23C 18/31* (2013.01); *C23C 18/38* (2013.01); *H05K 1/0296* (2013.01); *H05K 3/184* (2013.01); *B32B 2307/202* (2013.01); *B32B 2457/208* (2013.01); *C23C 18/1653* (2013.01); *C23C 18/54* (2013.01); *G06F 2203/04103* (2013.01); *G06F 2203/04111* (2013.01); *G06F 2203/04112* (2013.01); *H05K 2201/09245* (2013.01); *H05K 2201/10128* (2013.01); *H05K 2203/0557* (2013.01); *H05K 2203/072* (2013.01)

(58) Field of Classification Search
CPC ........... G06F 3/044; G06F 2203/04111; G06F 2203/04112; G06F 2203/04103; H05K 2201/10128; H05K 3/184; H05K 1/0296; H05K 2203/072; H05K 2203/0557; H05K 2201/09245; C23C 18/1605; C23C 18/1653; C23C 18/2086; C23C 18/38; C23C 18/30; C23C 18/54; C23C 18/31
See application file for complete search history.

(56) References Cited

FOREIGN PATENT DOCUMENTS

| | | |
|---|---|---|
| JP | 2006-135271 A | 5/2006 |
| JP | 2009-007540 A | 1/2009 |
| JP | 2009-026895 A | 2/2009 |
| JP | 2009-245653 A | 10/2009 |
| JP | 2009-280905 A | 12/2009 |
| JP | 2012-163951 A | 8/2012 |
| JP | 2013-254731 A | 12/2013 |
| JP | 5486536 B2 | 5/2014 |

OTHER PUBLICATIONS

Written Opinion issued in PCT/JP2016/065628; dated Aug. 16, 2016.

* cited by examiner

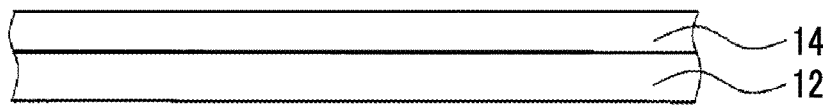
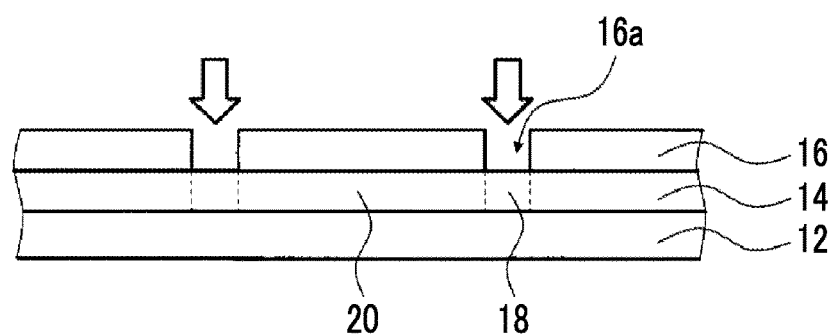
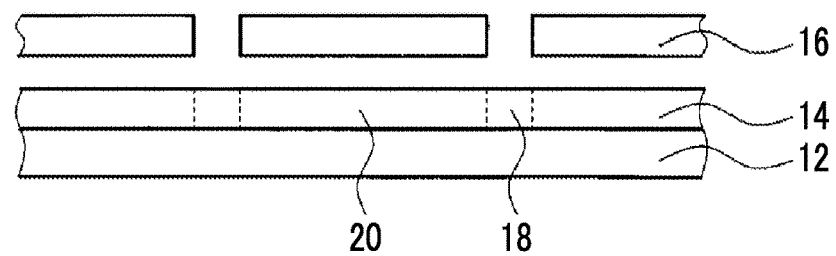
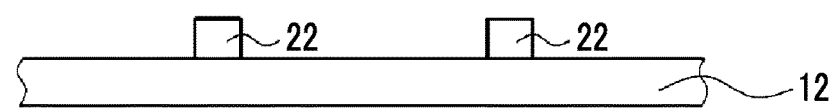

CONDUCTIVE FILM, TOUCH PANEL SENSOR, AND TOUCH PANEL

CROSS-REFERENCE TO RELATED APPLICATIONS

This application is a Continuation of PCT International Application No. PCT/JP2016/065628 filed on May 26, 2016, which claims priority under 35 U.S.C. § 119(a) to Japanese Patent Application No. 2015-110717 filed on May 29, 2015. The above application is hereby expressly incorporated by reference, in its entirety, into the present application.

BACKGROUND OF THE INVENTION

1. Field of the Invention

The present invention relates to a conductive film, a touch panel sensor, and a touch panel.

2. Description of the Related Art

Conductive films having a conductive thin wire formed on a substrate are used for various purposes. Particularly, in recent years, the demand for a conductive film for a touch panel sensor has been rapidly expanded with an increasing rate of mounting of a touch panel on a cellular phone or a portable game device.

As the conductive film, for example, JP2012-63951A discloses a conductive film which is provided with a conductive portion having a mesh pattern of thin wires made of a metal (metal thin wires). In JP2012-163951A, a plurality of methods for manufacturing the conductive portion are described. For example, on a transparent base, a to-be-plated layer including a functional group interacting with a plating catalyst or a precursor thereof is formed, an exposure treatment and a development treatment are performed on the to-be-plated layer, and then a plating treatment is performed on the to-be-plated layer subjected to the treatments to form a metal portion on the to-be-plated layer.

SUMMARY OF THE INVENTION

In JP2012-163951A, using the above-described to-be-plated layer is just an example and is not specifically demonstrated.

The inventors formed a mesh-like to-be-plated layer to form a mesh pattern consisting of metal thin wires in accordance with the method (JP2006-135271A) described in JP2012-163951A, and then formed a mesh-like metal portion on the to-be-plated layer by performing a plating treatment. The inventors found that the metal wire width at intersections at which the metal thin wires of the obtained mesh pattern intersect is thicker than the width of the metal thin wires of other regions. It is not preferable that the intersections become thick since the metal color (tint) of the metal wires is strongly exhibited and the metal wires become easy to visually recognize.

As means for suppressing the thickening at the intersections, there is a method for reducing a plating amount that precipitates during the plating treatment. However, in this method, conductive characteristics of metal thin wires to be formed are reduced.

An object of the invention is to provide a conductive film which has a mesh-like metal layer composed of metal thin wires and in which visual recognition of the metal thin wires is suppressed and the metal layer has excellent conductive characteristics.

Another object of the invention is to provide a touch panel sensor and a touch panel including the conductive film.

The inventors have conducted intensive studies about the problems of the related art, and found that the objects can be achieved in a case where the mesh-like metal layer satisfies a predetermined parameter.

That is, the inventors have found that the objects can be achieved with the following configuration.

(1) A conductive film comprising: a substrate; a patterned to-be-plated layer which is disposed on the substrate in a mesh pattern and has a functional group interacting with a plating catalyst or a precursor thereof; and a mesh-like metal layer which is disposed on the patterned to-be-plated layer and has a plurality of metal thin wires intersecting each other, in which an average thickness of the patterned to-be-plated layer is 0.05 to 100 μm, an average thickness of the metal layer is 0.05 to 0.5 μm, and an average intersection growing rate at an intersection of metal thin wires of the mesh of the metal layer is 1.6 or less, Average Intersection Growing Rate: an average value obtained by calculating an intersection growing rate at 100 intersections of the metal thin wires and by then arithmetically averaging the rates $$\text{Intersection Growing Rate} = Cw/(1.4142 \times Lw)$$

Where $Cw$ represents, in a case where a circle is drawn which is inscribed in an intersection of the metal thin wires, a diameter of the circle, and $Lw$ represents an average wire width of the metal thin wires.

(2) The conductive film according to (1), in which the average wire width of the metal thin wires is 5 μm or less.

(3) The conductive film according to (1) or (2), in which the patterned to-be-plated layer is formed in such a manner that a layer for forming a to-be-plated layer containing a compound X or a composition Y to be described later is formed on the substrate and brought into close contact with a photomask under vacuum, and an exposure treatment is performed on the layer for forming a to-be-plated layer in a mesh pattern.

(4) The conductive film according to any one of (1) to (3), in which the metal layer is formed in such a manner that a plating catalyst or a precursor thereof is applied to the patterned to-be-plated layer, and a plating treatment is performed on the patterned to-be-plated layer to which the plating catalyst or the precursor thereof has been applied.

(5) A touch panel sensor comprising: the conductive film according to any one of (1) to (4).

(6) A touch panel comprising: the conductive film according to any one of (1) to (4).

According to the invention, it is possible to provide a conductive film which has a mesh-like metal layer composed of metal thin wires and in which visual recognition of the metal thin wires is suppressed and the metal layer has excellent conductive characteristics.

According to the invention, it is also possible to provide a touch panel sensor and a touch panel including the conductive film.

BRIEF DESCRIPTION OF THE DRAWINGS

FIG. 3A is a cross-sectional view schematically illustrating an example of a state in which a layer for forming a to-be-plated layer is formed.

FIG. 3B is a cross-sectional view schematically illustrating an example of the exposure treatment for the layer for forming a to-be-plated layer.

FIG. 3C is a cross-sectional view schematically illustrating the removal of a photomask.

FIG. 3D is a cross-sectional view schematically illustrating an example of a state in which a patterned to-be-plated layer is formed by a development treatment.

DESCRIPTION OF THE PREFERRED EMBODIMENTS

Hereinafter, a conductive film, a touch panel sensor, and a touch panel according to the invention will be described in detail. In this specification, a numerical value range expressed using the expression "to" means a numerical value range including numerical values before and after the expression as a lower limit value and an upper limit value.

A characteristic of the conductive film according to the invention is that an average intersection growing rate to be described later is equal to or lower than a predetermined value. Hereinafter, this will be described in detail using the drawings.

Figure 1A:
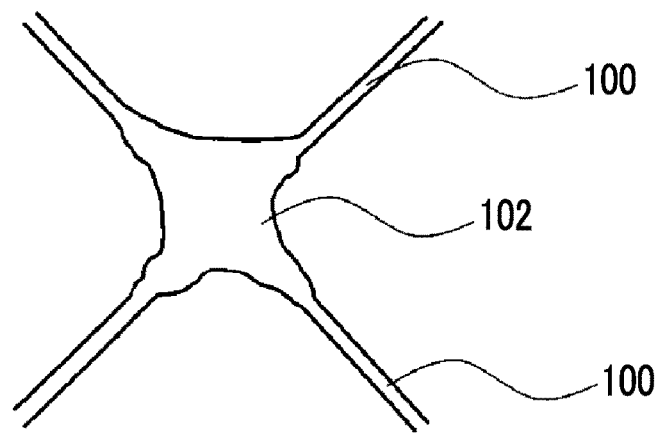
FIG. 1A is an enlarged plan view of an intersection at which metal thin wires in a conductive film of the related art intersect.

The inventors have conducted studies about a cause why a desired effect is not obtained in the related art, and found that a metal wire width becomes thicker (increases) at intersections of metal thin wires. Specifically, as illustrated in FIG. 1A, in a conductive film obtained by the method described in the related art (JP2012-163951A), a width at an intersection 102 at which metal thin wires 100 intersect becomes thicker, and as a result, the metal thin wires become easy to visually recognize.

Figure 1B:
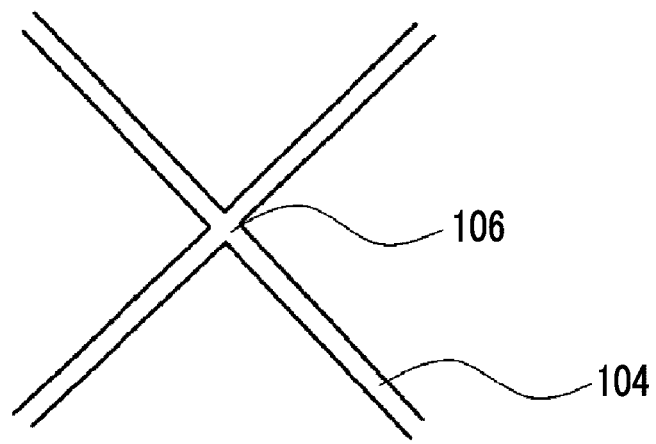
FIG. 1B is an enlarged plan view of an intersection at which metal thin wires in a conductive film according to the invention intersect.

In contrast, in a conductive film according to the invention, an average intersection growing rate to be described later in detail is equal to or lower than a predetermined value, and this means that as illustrated in FIG. 1B, the thickening of a metal wire width at an intersection 106 at which metal thin wires 104 is suppressed.

According to the invention, a reason why an average intersection growing rate which is equal to or lower than a predetermined value as described above is obtained is that as will be described later in detail, in forming a patterned to-be-plated layer, an exposure treatment is performed in a state in which a layer for forming a to-be-plated layer and a photomask are brought into close contact with each other under vacuum.

Figure 2A:
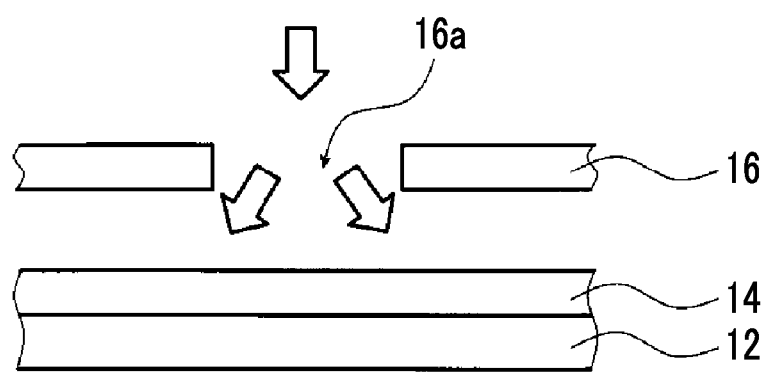
FIG. 2A is a conceptual diagram illustrating a method for an exposure treatment of the related art.
Figure 2B:
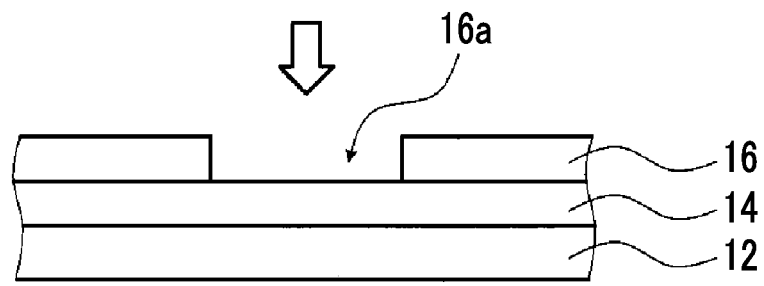
FIG. 2B is a conceptual diagram illustrating a method for an exposure treatment which is performed in the invention.

Specifically, the inventors have found that a method for the exposure treatment in forming the patterned to-be-plated layer has an influence as a cause why a metal wire width at an intersection becomes thicker as described above in the related art. As illustrated in FIG. 2A, in a case where there is a space between a layer 14 for forming a to-be-plated layer disposed on a substrate 12 and a photomask 16 during the exposure treatment, the light applied passes through an opening 16a of the photomask 16, and then spreads before reaching the layer 14 for forming a to-be-plated layer. Thus, an area wider than a predetermined opening width is exposed. Particularly, such a phenomenon occurs remarkably at intersections. Accordingly, at intersections of the mesh pattern of the patterned to-be-plated layer, a to-be-plated layer remains which is larger than the line width of the lines of the mesh pattern, and the area of a metal layer to be formed on the intersections also increases. In contrast, according to the invention, as illustrated in FIG. 2B, the exposure treatment is performed such that the layer 14 for forming a to-be-plated layer and the photomask 16 are brought into close contact with each other under vacuum. Therefore, the spreading of the exposure as described above is suppressed, and as a result, the remaining of an extra to-be-plated layer on the intersections is suppressed. Therefore, an increase in the area of the metal layer is suppressed at the intersections after the plating treatment.

Hereinafter, a method for manufacturing a conductive film will be described in detail, and then a conductive film will be described in detail.

The method for manufacturing a conductive film according to the invention is not particularly limited, but preferably has a step for forming a patterned to-be-plated layer on a substrate (patterned to-be-plated layer forming step) and a step for forming a metal layer on the patterned to-be-plated layer (metal layer forming step) in view of efficiently manufacturing a conductive film having predetermined characteristics. Hereinafter, a procedure of the steps will be described in detail.

<<Patterned To-Be-Plated Layer Forming Step (Hereinafter, also Referred to as Step X)>>

The step X is a step for forming a patterned to-be-plated layer on a substrate. Specifically, the step X includes a step X1 of forming a layer for forming a to-be-plated layer which is a precursor layer of a to-be-plated layer on a substrate, a step X2 of performing an exposure treatment, and a step X3 of performing a development treatment.

Hereinafter, the steps X1 to X3 will be described in detail with reference to the drawings.

<Step X1>

The step X1 is a step for forming a layer for forming a to-be-plated layer on a substrate. The layer for forming a to-be-plated layer corresponds to a precursor layer of a to-be-plated layer to be described later.

FIGS. 3A to 3D are cross-sectional views schematically illustrating an example of the patterned to-be-plated layer forming step. FIG. 3A is a cross-sectional view schematically illustrating an example of a state in which a layer 14 for forming a to-be-plated layer is formed. The layer 14 for forming a to-be-plated layer is disposed on (directly above) a substrate 12.

In the example of FIG. 3A, the layer 14 for forming a to-be-plated layer is applied to the whole surface of the substrate 12. However, the invention is not limited thereto, and the layer 14 for forming a to-be-plated layer may be formed on a part of the surface of the substrate 12.

Hereinafter, first, materials which are used in the step X1 will be described in detail, and then a procedure of the step X1 will be described in detail.

(Substrate)

The type of the substrate 12 is not particularly limited, and examples thereof include an insulating substrate. Specific examples of the substrate 12 include a resin substrate, a ceramic substrate, and a glass substrate.

The thickness (mm) of the substrate 12 is not particularly limited. In view of handleability and a reduction in the thickness, the thickness is preferably 0.01 to 1 mm, and more preferably 0.02 to 0.5 mm.

It is preferable that the substrate 12 appropriately transmits light. Specifically, the total luminous transmittance of the substrate 12 is preferably 85% to 100%.

The substrate 12 may be sheet-like (single sheet) or long (continuous body). For example, in a case where a long film is used as the substrate 12, after formation of a patterned to-be-plated layer 22 to be described later, the long film may be wound into a roll such that the surface on which the patterned to-be-plated layer 22 is formed is on the inner side.

(Procedure of Step X1)

The method for forming the layer for forming a to-be-plated layer on the substrate is not particularly limited. Examples thereof include a method for applying (coating) a to-be-plated layer forming composition on a substrate by a known method (for example, spin coating, die coating, dip coating, or the like). Details of the to-be-plated layer forming composition will be described later.

From the viewpoint of handleability and manufacturing efficiency, a drying treatment may be performed if necessary to remove the remaining solvent after the application of the to-be-plated layer forming composition.

The drying treatment conditions are not particularly limited. In view of more excellent productivity, the drying treatment is preferably performed at room temperature (20° C.) to 220° C. (preferably 50° C. to 120° C.) for 1 to 30 minutes (preferably 1 to 10 minutes).

The average thickness of the layer for forming a to-be-plated layer is not particularly limited as long as a patterned to-be-plated layer having a predetermined average thickness to be described layer is obtained. The average thickness is preferably, for example, 0.05 to 100 μm.

The average thickness of the layer for forming a to-be-plated layer is a value obtained by measuring thicknesses of ten arbitrary points of the layer for forming a to-be-plated layer and by then arithmetically averaging the thicknesses.

<Step X2>

The step X2 is a step for bringing the layer for forming a to-be-plated layer and the photomask into close contact with each other under vacuum to expose the layer for forming a to-be-plated layer in a pattern (in a mesh pattern).

In a case where the exposure treatment is performed under vacuum as described above, there is an advantage in that oxygen inhibition can be reduced during the polymerization of the layer for forming a to-be-plated layer and the layer for forming a to-be-plated layer has excellent curability, in addition to the above-described effect.

FIG. 3B is a cross-sectional view schematically illustrating an example of the exposure treatment for the layer 14 for forming a to-be-plated layer. As illustrated in FIG. 3B, due to the exposure treatment, the layer 14 for forming a to-be-plated layer has exposed regions (exposed portions) 18 which are portions irradiated with light passing through the openings 16a of the photomask 16 having the mesh-like openings 16a, and unexposed regions (unexposed portions) 20 which are portions not irradiated with light. The layer is exposed in a mesh pattern. Specifically, the exposure treatment is performed in a region where a mesh-like patterned to-be-plated layer is to be formed as illustrated in FIG. 4A to be described later.

The layer 14 for forming a to-be-plated layer and the photomask 16 are exposed in a state of being brought into close contact with each other under vacuum.

As a method for bringing the layer 14 for forming a to-be-plated layer and the photomask 16 into close contact with each other under vacuum, for example, a device using a known vacuum mechanism (for example, a vacuum pump such as a rotary pump) can be used.

Here, in the invention, the vacuum conceptually includes a negative pressure representing a state in which the pressure is lower than a normal atmospheric pressure. Specifically, according to the invention, the pressure in vacuum is preferably 200 Pa or less, more preferably 150 Pa or less, and even more preferably 0.01 to 100 Pa.

In the exposure treatment, the exposure is performed with light having an optimum wavelength depending on the material of the layer for forming a to-be-plated layer to be used. For example, an irradiation device provided with a light irradiation mechanism using UV light (ultraviolet light) or visible light is used. As a light source, for example, a mercury lamp, a metal halide lamp, a xenon lamp, a chemical lamp, a carbon arc lamp, or the like is used. Electron beams, X-rays, ion beams, far-infrared rays, or the like can also be used.

The irradiation device which is used in the exposure treatment is preferably a parallel light exposure device in view of more improving the pattern accuracy of the layer for forming a to-be-plated layer to be formed.

In the exposure treatment, the wavelength of the light to be applied is preferably 300 nm or less, and more preferably 200 to 270 nm or less from the viewpoint of forming a finer pattern.

The exposure time varies according to the reactivity of the material of the layer for forming a to-be-plated layer and the light source, and is generally 10 seconds to 5 hours. The exposure energy may be about 10 to 8,000 mJ, and is preferably in a range of 50 to 3,000 mJ.

As a step for forming such an exposure treatment, an example of a case where the exposure is performed using a device having both of a vacuum mechanism and an exposure mechanism will be shown.

First, the layer 14 for forming a to-be-plated layer and the photomask 16 are laminated (brought into contact with each other) and the laminate is placed in a chamber of a device provided with a vacuum mechanism (vacuum pump or the like) and an exposure mechanism. Then, the vacuum mechanism is operated to turn the inside of the chamber into a vacuum state. Accordingly, the layer 14 for forming a to-be-plated layer and the photomask 16 are brought into close contact with each other under vacuum.

The vacuum state is kept and the exposure mechanism is operated to perform an exposure treatment to thus apply light toward the layer 14 for forming a to-be-plated layer from the top of the photomask 16. Accordingly, in the layer 14 for forming a to-be-plated layer, an exposure pattern consisting of exposed portions 18 which are portions irradiated with light passing through the openings 16a of the photomask 16 and unexposed portions 20 which are portions not irradiated with light by the photomask 16 is formed.

The type of the photomask 16 is not particularly limited, and for example, a known mask such as a glass mask (a chromium mask having a chromium film which covers a glass surface, or an emulsion mask having a film which includes gelatin and silver halide and covers a glass surface)

or a film mask (polyester film) can be used. Among these, a glass mask is preferably used in view of excellent adhesiveness to the layer 14 for forming a to-be-plated layer under vacuum.

The thickness of the photomask is not particularly limited. For example, the thickness is preferably 20 to 500 mm, and more preferably 20 to 150 mm.

The openings 16a of the photomask 16 have a mesh shape (mesh pattern) as described above. The shape of the mesh is the same as the shape of a predetermined patterned to-be-plated layer to be described later, and will be described later in detail.

The step X2 may have a step for removing the mask after the exposure treatment.

FIG. 3C is a cross-sectional view schematically illustrating the removal of the photomask 16 after the exposure treatment and before a development treatment to be described later. The example of FIG. 3C illustrates a case where the photomask 16 is removed before the development treatment to be described later, but the invention is not limited thereto. The removal of the photomask may be performed simultaneously with or after the development treatment.

The photomask 16 is preferably removed in a state in which the layer gets out of the vacuum state (for example, at atmospheric pressure) after the above-described exposure treatment. The method for removing the photomask 16 is not particularly limited, and a known method may be used to remove the photomask.

<Step X3>

The step X3 is a step for forming a patterned to-be-plated layer by performing the development treatment on the layer for forming a to-be-plated layer. By performing this step, a substrate with a patterned to-be-plated layer, which includes the substrate and the patterned to-be-plated layer disposed on the substrate, is obtained.

Figure 4:
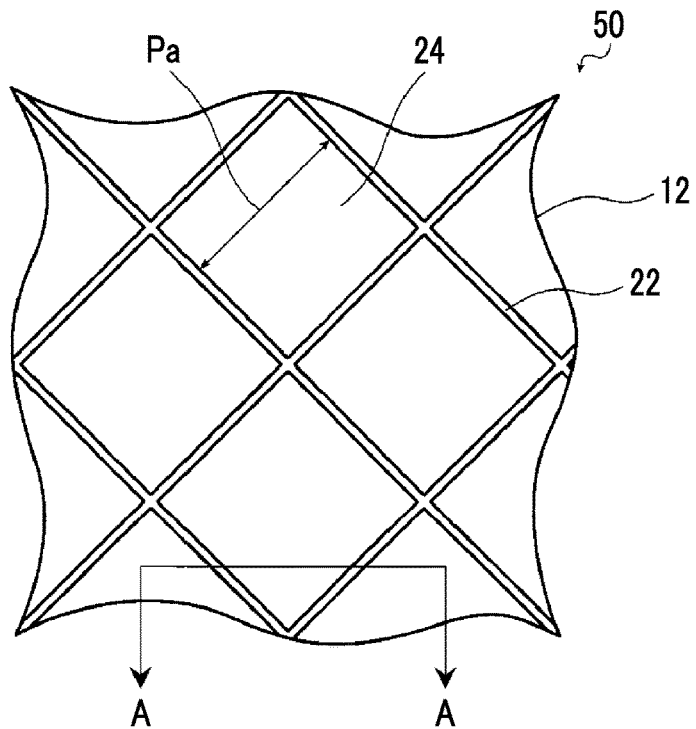
FIG. 4 is a top view of a substrate with a patterned to-be-plated layer.

FIG. 3D is a cross-sectional view schematically illustrating an example of the state in which the patterned to-be-plated layer is formed by the development treatment. FIG. 4 is a top view of a substrate 50 with a patterned to-be-plated layer obtained through the step X3. FIG. 3D corresponds to the sectional view taken along the line A-A of FIG. 4. As illustrated in FIG. 4, the substrate 50 with a patterned to-be-plated layer has the substrate 12 and a patterned to-be-plated layer 22. The patterned to-be-plated layer 22 has a mesh pattern formed from a thin line-like to-be-plated layer (thin line portion) and openings 24 (in the example of FIG. 4, substantially rhombus shape).

The configuration of the patterned to-be-plated layer 22 will be described later in detail.

The example of FIG. 3D illustrates a case where the development treatment is a treatment for removing the unexposed portions 20 (see FIG. 3C) in the layer 14 for forming a to-be-plated layer. Due to this treatment, the exposed portions 18 are patterned and the patterned to-be-plated layer 22 having the same shape as the openings 16a of the pattern is obtained. The example of FIG. 3D illustrates a case where the layer 14 for forming a to-be-plated layer is formed using a so-called negative-type to-be-plated layer forming composition.

The layer for forming a to-be-plated layer may be formed using a positive-type to-be-plated layer forming composition. In that case, the exposed portions are removed by the development treatment such that the unexposed portions remain, and a mesh-like patterned to-be-plated layer is formed.

The method for the development treatment is not particularly limited. Examples thereof include a method for immersing the layer 14 for forming a to-be-plated layer after the exposure treatment in a developer (alkaline solution, organic solvent, water, or the like) and a method for coating the surface of the layer 14 for forming a to-be-plated layer with a developer, and an immersing method is preferable. In the immersing method, the immersion time is preferably 1 to 30 minutes from the viewpoint of productivity and workability.

The contact angle of a surface of the patterned to-be-plated layer 22 obtained as described above is preferably 90° to 120°, more preferably 100° to 120°, and even more preferably 105° to 120°. In a case where the contact angle is within the above range, the peelability between the layer 14 for forming a to-be-plated layer and the photomask 16 after the exposure treatment is further improved, or the adhesion of the layer 14 for forming a to-be-plated layer with respect to the photomask 16 can be further suppressed.

According to the invention, the contact angle of the patterned to-be-plated layer means a contact angle with respect to water, and it is measured using a tangent method as a measuring method.

<To-Be-Plated Layer Forming Composition>

The layer for forming a to-be-plated layer is preferably formed using a to-be-plated layer forming composition containing a surfactant. Hereinafter, components contained in the to-be-plated layer forming composition and components which may be contained will be described in detail.

(Surfactant)

The to-be-plated layer forming composition according to the invention preferably contains a surfactant. Accordingly, in the method for manufacturing a patterned to-be-plated layer according to the invention, by the action of the surfactant contained in the layer for forming a to-be-plated layer, the photomask after the exposure treatment is easily removed, and the adhesion of a part of the layer for forming a to-be-plated layer to the photomask can be suppressed. In addition, since the contamination of the photomask can also be suppressed, there is an advantage in the process in that the number of times of photomask washing can be reduced or the photomask washing can be eliminated.

As the surfactant, various surfactants such as fluorine-based surfactants, nonionic surfactants, cationic surfactants, anionic surfactants, and silicone-based surfactants can be used. Among these, fluorine-based surfactants and silicone-based surfactants are preferable, and fluorine-based surfactants are more preferable in view of further exhibiting the above-described effect. The surfactant may be used alone or in combination of two or more types thereof.

Examples of the fluorine-based surfactants include W-AHE, W-AHI (all manufactured by FUJIFILM CORPORATION), MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781F (all manufactured by DIC CORPORATION), FLUORAD FC430, FLUORAD FC431, FLUORAD FC171 (all manufactured BY 3M JAPAN LIMITED), SURFLON S-382, SURFLONSC-101, SURFLON SC-103, SURFLON SC-104, SURFLON SC-105, SURFLON SC1068, SURFLON SC-381, SURFLON SC-383, SURFLON S393, SURFLON KH-40 (all manufactured by ASAHI GLASS CO., LTD), PF636, PF656, PF6320, PF6520, and PF7002 (manufactured by OMNOVA SOLUTIONS INC.).

Commercially available products can be used as the silicone-based surfactant, and examples thereof include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, TORAY SILICONE SH8400 (all manufactured by DOW CORNING TORAY CO., LTD.), TSF-4440, TSF-4300, TSF-4445, TSF-4460, TSF-4452 (all manufactured by MOMENTIVE PERFORMANCE MATERIALS INC.), KP341, KF6001, KF6002 (all manufactured by SHIN-ETSU CHEMICAL CO., LTD.), BYK307, BYK323, and BYK330 (all manufactured by BYK ADDITIVES & INSTRUMENTS).

The content of the surfactant is preferably 0.005 to 0.5 mass %, more preferably 0.01 to 0.1 mass %, and even more preferably 0.01 to 0.05 mass % with respect to 100 mass % of a total of the to-be-plated layer forming composition. In a case where the content of the surfactant is 0.005 mass % or greater, the peelability of the photomask is further improved and the adhesion of the layer for forming a to-be-plated layer to the photomask is further reduced. In addition, in a case where the content of the surfactant is 0.5 mass % or less, the ooze of the surfactant contained in the layer for forming a to-be-plated layer to the substrate side can be suppressed, and thus the adhesiveness between the patterned to-be-plated layer and the substrate is improved.

(Other Components)

The to-be-plated layer forming composition according to the invention preferably contains the following compound X or composition Y.

Compound X: a compound having a functional group interacting with a plating catalyst or a precursor thereof (hereinafter, also referred to as "interactive group"), and a polymerizable group Composition Y: a composition including a compound having a functional group interacting with a plating catalyst or a precursor thereof, and a compound having a polymerizable group (Compound X)

The compound X is a compound having an interactive group and a polymerizable group.

The interactive group means a functional group which can interact with a plating catalyst or a precursor thereof which is applied to the patterned to-be-plated layer. For example, a functional group which can form an electrostatic interaction with a plating catalyst or a precursor thereof, or a nitrogen-containing functional group, a sulfur-containing functional group, or an oxygen-containing functional group which can form coordination with a plating catalyst or a precursor thereof can be used.

Specific examples of the interactive group include nitrogen-containing functional groups such as an amino group, an amide group, an imide group, an urea group, a tertiary amino group, an ammonium group, an amidino group, a triazine ring, a triazole ring, a benzotriazole group, an imidazole group, a benzimidazole group, a quinolone group, a pyridine group, a pyrimidine group, a pyrazine group, a nazoline group, a quinoxaline group, a purine group, a triazine group, a piperidine group, a piperazine group, a pyrrolidine group, a pyrazole group, an aniline group, a group containing an alkylamine group structure, a group containing an isocyanuric structure, a nitro group, a nitroso group, an azo group, a diazo group, an azido group, a cyano group, and a cyanate group; oxygen-containing functional groups such as an ether group, a hydroxyl group, a phenolic hydroxyl group, a carboxylic acid group, a carbonate group, a carbonyl group, an ester group, a group containing an N-oxide structure, a group containing an S-oxide structure, and a group containing an N-hydroxy structure; sulfur-containing functional groups such as a thiophene group, a thiol group, a thiourea group, a thiocyanuric acid group, a benzothiazole group, a mercaptotriazine group, a thioether group, a thioxy group, a sulfoxide group, a sulfone group, a sulfite group, a group containing a sulfoxyimine structure, a group containing a sulfoxynium salt structure, a sulfonate group, and a group containing a sulfonate structure; phosphorus-containing functional groups such as a phosphate group, a phosphoroamido group, a phosphine group, and a group containing a phosphate structure; and a group containing a halogen atom such as chlorine and bromine. Regarding the functional groups which can take a salt structure, salts thereof can also be used.

Among these, an ionic polar group such as a carboxylic acid group, a sulfonate group, a phosphate group, or a boronic acid group, an ether group, or a cyano group is preferable, and a carboxylic acid group (carboxyl group) or a cyano group is more preferable since these have high polarity and high absorption capacity to a plating catalyst or a precursor thereof.

The compound X may contain two or more types of interactive groups.

The polymerizable group is a functional group which can form a chemical bond by the application of energy, and examples thereof include a radical polymerizable group and a cationic polymerizable group. Among these, a radical polymerizable group is preferable in view of more excellent reactivity thereof. Examples of the radical polymerizable group include unsaturated carboxylic ester groups such as an acrylic ester group (acryloyloxy group), a methacrylic ester group (methacryloyloxy group), an itaconic ester group, a crotonic ester group, an isocrotonic ester group, and a maleic ester group, a styryl group, a vinyl group, an acrylamide group, and a methacrylamide group. Among these, a methacryloyloxy group, an acryloyloxy group, a vinyl group, a styryl group, an acrylamide group, or a methacrylamide group is preferable, and a methacryloyloxy group, an acryloyloxy group, or a styryl group is more preferable.

The compound X may contain two or more types of polymerizable groups. The number of polymerizable groups contained in the compound X is not particularly limited, and may be one or two or more.

The compound X may be a low molecular compound or a high molecular compound. The low molecular compound means a compound having a molecular weight of less than 1,000, and the high molecular compound means a compound having a molecular weight of 1,000 or greater.

A low molecular compound having the polymerizable group corresponds to a so-called monomer. The high molecular compound may be a polymer having a predetermined repeating unit.

The compound may be used alone or in combination of two or more types thereof.

In a case where the compound X is a polymer, the weight average molecular weight of the polymer is not particularly limited. In view of more excellent solubility and handleability, the weight average molecular weight is preferably 1,000 to 700,000, and more preferably 2,000 to 200,000. Particularly, the weight average molecular weight is even more preferably 20,000 or greater from the viewpoint of polymerization sensitivity.

The method for synthesizing the polymer having a polymerizable group and an interactive group is not particularly limited, and examples thereof include known synthesis methods (paragraphs [0097] to [0125] of JP2009-280905A).

(Preferable Aspect 1 of Polymer)

A first preferable aspect of the polymer is, for example, a copolymer containing a repeating unit having a polymerizable group represented by Formula (a) (hereinafter, also referred to as a proper polymerizable group unit) and a repeating unit having an interactive group represented by Formula (b) (hereinafter, also referred to as a proper interactive group unit).

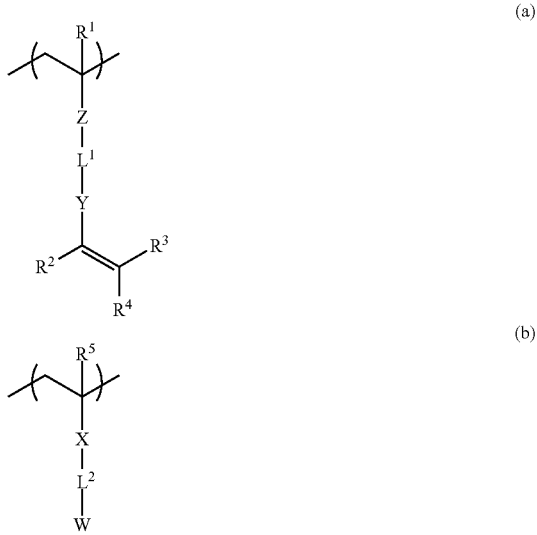

In Formulae (a) and (b), $R^1$ to $R^5$ each independently represent a hydrogen atom or a substituted or unsubstituted alkyl group (for example, methyl group, ethyl group, propyl group, and butyl group). The substituent type is not particularly limited, and examples of the substituent include a methoxy group, a chlorine atom, a bromine atom, and a fluorine atom.

$R^1$ is preferably a hydrogen atom, a methyl group, or a methyl group substituted with a bromine atom. $R^2$ is preferably a hydrogen atom, a methyl group, or a methyl group substituted with a bromine atom. $R^3$ is preferably a hydrogen atom. $R^4$ is preferably a hydrogen atom. $R^5$ is preferably a hydrogen atom, a methyl group, or a methyl group substituted with a bromine atom.

In Formulae (a) and (b), X, Y, and Z each independently represent a single bond or a substituted or unsubstituted divalent organic group. Examples of the divalent organic group include a substituted or unsubstituted divalent aliphatic hydrocarbon group (preferably having 1 to 8 carbon atoms., e.g., alkylene group such as methylene group, ethylene group, and propylene group), a substituted or unsubstituted divalent aromatic hydrocarbon group (preferably having 6 to 12 carbon atoms., e.g., phenylene group), —O—, —S—, —SO$_2$—, —N(R)— (R: alkyl group), —CO—, —NH—, —COO—, —CONH—, and a group obtained by combining two or more of the above groups (for example, alkyleneoxy group, alkyleneoxycarbonyl group, and alkylenecarbonyloxy group).

In view of easy synthesis of the polymer and more excellent adhesiveness of the metal layer, each of X, Y, and Z is preferably a single bond, an ester group (—COO—), an amide group (—CONH—), an ether group (—O—), or a substituted or unsubstituted divalent aromatic hydrocarbon group, and more preferably a single bond, an ester group (—COO—), or an amide group (—CONH—).

In Formulae (a) and (b), $L^1$ and $L^2$ each independently represent a single bond or a substituted or unsubstituted divalent organic group. The divalent organic group is synonymous in definition with the divalent organic groups described in the description of X, Y, and Z.

$L^1$ is preferably an aliphatic hydrocarbon group or a divalent organic group having a urethane bond or a urea bond (for example, aliphatic hydrocarbon group) in view of easy synthesis of the polymer and more excellent adhesiveness of the metal layer. Among these, a group having a total of 1 to 9 carbon atoms is preferable. Here, the total number of carbon atoms of $L^1$ means a total number of carbon atoms contained in the substituted or unsubstituted divalent organic group represented by $L^1$.

$L^2$ is preferably a single bond, a divalent aliphatic hydrocarbon group, a divalent aromatic hydrocarbon group, or a group obtained by combining two or more of the above groups in view of more excellent adhesiveness of the metal layer. Among these, $L^2$ is preferably a single bond or a group having a total of 1 to 15 carbon atoms. The divalent organic group represented by $L^2$ is preferably unsubstituted. Here, the total number of carbon atoms of $L^2$ means a total number of carbon atoms contained in the substituted or unsubstituted divalent organic group represented by $L^2$.

In Formula (b), W represents an interactive group. The definition of the interactive group is as described above.

The content of the polymerizable group unit is preferably 5 to 50 mol %, and more preferably 5 to 40 mol % with respect to the total repeating units in the polymer in view of reactivity (curability, polymerizability) and suppression of gelation during the synthesis.

The content of the interactive group unit is preferably 5 to 95 mol %, and more preferably 10 to 95 mol % with respect to the total repeating units in the polymer from the viewpoint of absorption property to a plating catalyst or a precursor thereof (Preferable Aspect 2 of Polymer)

A second preferable aspect of the polymer is, for example, a copolymer containing repeating units represented by Formulae (A), (B), and (C), respectively.

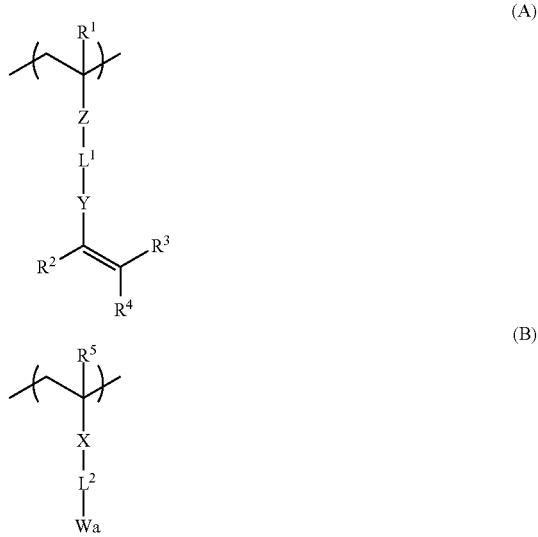

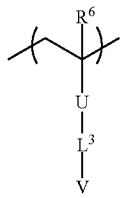

The repeating unit represented by Formula (A) is the same as the repeating unit represented by Formula (a), and the description of the respective groups is also the same.

$R^5$, X, and $L^2$ in the repeating unit represented by Formula (B) are the same as $R^5$, X, and $L^2$ in the repeating unit represented by Formula (b), and the description of the respective groups is also the same.

Wa in Formula (B) represents a group interacting with a plating catalyst or a precursor thereof, excluding a hydrophilic group or a precursor thereof represented by V to be described later. Among these, a cyano group is preferable.

In Formula (C), $R^6$ represents a hydrogen atom or a substituted or unsubstituted alkyl group.

In Formula (C), U represents a single bond or a substituted or unsubstituted divalent organic group. The divalent organic group is synonymous in definition with the divalent organic groups represented by X, Y, and Z described above. In view of easy synthesis of the polymer and more excellent adhesiveness of the metal layer, U is preferably a single bond, an ester group (—COO—), an amide group (—CONH—), an ether group (—O—), or a substituted or unsubstituted divalent aromatic hydrocarbon group.

In Formula (C), $L^3$ represents a single bond or a substituted or unsubstituted divalent organic group. The divalent organic group is synonymous in definition with the divalent organic groups represented by $L^1$ and $L^2$ described above. In view of easy synthesis of the polymer and more excellent adhesiveness of the metal layer, $L^3$ is preferably a single bond, a divalent aliphatic hydrocarbon group, a divalent aromatic hydrocarbon group, or a group obtained by combining two or more of the above groups.

In Formula (C), V represents a hydrophilic group or a precursor thereof. The hydrophilic group is not particularly limited as long as it is a group having a hydrophilic property, and examples thereof include a hydroxyl group and a carboxylic acid group. In addition, a precursor group of a hydrophilic group means a group which generates a hydrophilic group by a predetermined treatment (for example, a treatment using an acid or alkali), and examples thereof include a carboxyl group protected by 2-tetrahydropyranyl group (THP).

The hydrophilic group is preferably an ionic polar group in view of interaction with a plating catalyst or a precursor thereof. Specific examples of the ionic polar group include a carboxylic acid group, a sulfonate group, a phosphate group, and a boronic acid group. Among these, a carboxylic acid group is preferable in view of proper acidity (other functional groups are not decomposed).

Preferable contents of the respective units in the second preferable aspect of the polymer are as follows.

The content of the repeating unit represented by Formula (A) is preferably 5 to 50 mol %, and more preferably 5 to 30 mol % with respect to the total repeating units in the polymer in view of reactivity (curability, polymerizability) and suppression of gelation during the synthesis.

The content of the repeating unit represented by Formula (B) is preferably 5 to 75 mol %, and more preferably 10 to 70 mol % with respect to the total repeating units in the polymer in view of absorption property to a plating catalyst or a precursor thereof.

The content of the repeating unit represented by Formula (C) is preferably 10 to 70 mol %, more preferably 20 to 60 mol %, and even more preferably 30 to 50 mol % with respect to the total repeating units in the polymer in view of developability by the aqueous solution and humidity-resistant adhesiveness.

Specific examples of the polymer include polymers described in paragraphs [0106] to [0112] of JP2009-007540A, polymers described in paragraphs [0065] to [0070] of JP2006-135271A, and polymers described in paragraphs [0030] to [0108] of US2010-080964A.

The polymer can be manufactured by a known method (for example, methods in the above literatures).

(Preferable Aspect of Monomer)

In a case where the compound is a so-called monomer, examples thereof include a compound represented by Formula (X) as a preferable aspect.

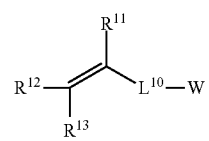

Formula (X)

In Formula (X), $R^{11}$ to $R^{13}$ each independently represent a hydrogen atom or a substituted or unsubstituted alkyl group. Examples of the unsubstituted alkyl group include a methyl group, an ethyl group, a propyl group, and a butyl group. Examples of the substituted alkyl group include a methyl group, an ethyl group, a propyl group, and a butyl group substituted with a methoxy group, a chlorine atom, a bromine atom, or a fluorine atom. $R^{11}$ is preferably a hydrogen atom or a methyl group. $R^{12}$ is preferably a hydrogen atom. $R^{13}$ is preferably a hydrogen atom.

$L^{10}$ represents a single bond or a divalent organic group. Examples of the divalent organic group include a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —$SO_2$—, —N(R)— (R: alkyl group), —CO—, —NH—, —COO—, —CONH—, and a group obtained by combining two or more of the above groups (for example, alkyleneoxy group, alkyleneoxycarbonyl group, and alkylenecarbonyloxy group).

Preferable examples of the substituted or unsubstituted aliphatic hydrocarbon group include a methylene group, an ethylene group, a propylene group, a butylene group, and the above groups substituted with a methoxy group, a chlorine atom, a bromine atom, or a fluorine atom.

Preferable examples of the substituted or unsubstituted aromatic hydrocarbon group include an unsubstituted phenylene group and a phenylene group substituted with a methoxy group, a chlorine atom, a bromine atom, or a fluorine atom.

In Formula (X), a preferable aspect of $L^{10}$ is —NH-aliphatic hydrocarbon group- or —CO-aliphatic hydrocarbon group-.

The definition of W is synonymous with the definition of W in Formula (b) and represents an interactive group. The definition of the interactive group is as described above.

In Formula (X), W is preferably an ionic polar group, and more preferably a carboxylic acid group.

(Composition Y)

The composition Y is a composition including a compound having an interactive group and a compound having a polymerizable group. That is, the layer for forming a to-be-plated layer includes two types of compounds, that is, a compound having an interactive group and a compound having a polymerizable group. The definitions of the interactive group and the polymerizable group are as described above.

The definition of the interactive group is as described above. The compound having an interactive group may be a low molecular compound or a high molecular compound. A preferable aspect of the compound having an interactive group is a polymer having a repeating unit represented by Formula (b) described above (for example, polyacrylic acid). The compound having an interactive group does not include a polymerizable group.

The compound having a polymerizable group is a so-called monomer, and is preferably a polyfunctional monomer having two or more polymerizable groups in view of more excellent hardness of a patterned to-be-plated layer to be formed. Specifically, the polyfunctional monomer is preferably a monomer having 2 to 6 polymerizable groups. From the viewpoint of kinetic property of molecules during a crosslinking reaction having an influence on the reactivity, the molecular weight of the polyfunctional monomer to be used is 150 to 1,000, and more preferably 200 to 800. The interval (distance) between polymerizable groups is preferably 1 to 15 in terms of the number of atoms.

The compound having a polymerizable group may not include an interactive group.

A preferable aspect of the compound having a polymerizable group is a compound represented by Formula (1).

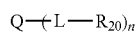

Formula (1)

In Formula (1), $R_{20}$ represents a polymerizable group.

L represents a single bond or a divalent organic group. The definition of the divalent organic group is as described above.

Q represents an n-valent organic group. Preferable examples of the n-valent organic group include a group represented by Formula (1A), a group represented by Formula (1B), (1A)

(1B)

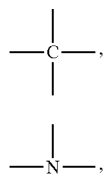

—NH—, —NR (R: alkyl group)-, —O—, —S—, a carbonyl group, an alkylene group, an alkenylene group, an alkynylene group, a cycloalkylene group, an aromatic group, a heterocyclic group, and an n-valent organic group consisting of a group obtained by combining two or more of the above groups.

n represents an integer of 2 or greater and is preferably 2 to 6.

Among the above-described polyfunctional monomers, a polyfunctional (meth)acrylamide is preferably used in view of more excellent hardness of a patterned to-be-plated layer to be formed.

The polyfunctional (meth)acrylamide is not particularly limited as long as it has two or more (preferably 2 to 6) (meth)acrylamide groups.

Among the polyfunctional (meth)acrylamides, a tetrafunctional (meth)acrylamide represented by Formula (A) can be more preferably used from the viewpoint of more excellent curing rate of the layer for forming a to-be-plated layer.

In the invention, the (meth)acrylamide conceptually includes both of an acrylamide and a methacrylamide.

The tetrafunctional (meth)acrylamide represented by Formula (A) can be manufactured by, for example, a manufacturing method described in JP5486536B.

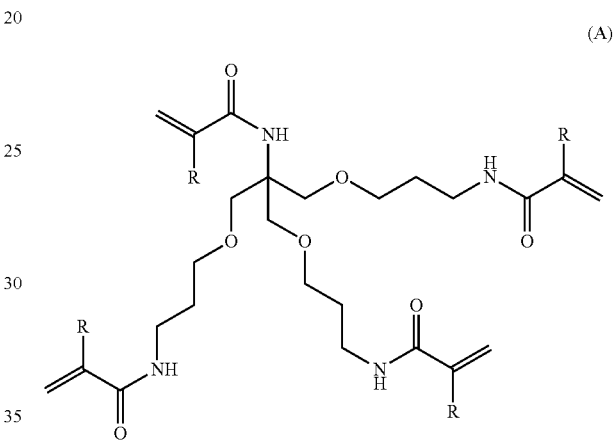

(A)

In Formula (A), R represents a hydrogen atom or a methyl group. In Formula (A), a plurality of R's may be the same as or different from each other.

The mass ratio between the compound having an interactive group and the compound having a polymerizable group (mass of the compound having an interactive group/mass of the compound having a polymerizable group) is not particularly limited. From the viewpoint of hardness and plating suitability of a to-be-plated layer to be formed, the mass ratio is preferably 0.1 to 10, and more preferably 0.5 to 5.

The content of the compound X (or composition Y) in the to-be-plated layer forming composition is not particularly limited. The content is preferably 50 mass % or greater, and more preferably 80 mass % or greater with respect to 100 mass % of a total solid content in the to-be-plated layer forming composition. The upper limit is not particularly limited, but preferably 99.5 mass % or less.

The layer for forming a to-be-plated layer and the to-be-plated layer forming composition may contain a component other than the above-described surfactant, compound X, and composition Y.

The layer for forming a to-be-plated layer and the to-be-plated layer forming composition may contain a polymerization initiator. In a case where a polymerization initiator is contained, the reaction between polymerizable groups more efficiently proceeds during the exposure treatment.

The polymerization initiator is not particularly limited, and a known polymerization initiator (so-called photopolymerization initiator) can be used. Examples of the polymerization initiator include benzophenones, acetophenones, α-aminoalkylphenones, benzophenones, ketones, thioxanthones, benzyls, benzyl ketals, oxime esters, anthrones, tetramethylthiuram monosulfides, bisacylphosphinoxides, acylphosphine oxides, anthraquinones, azo compounds, and derivatives thereof.

The content of the polymerization initiator in the layer for forming a to-be-plated layer is not particularly limited. In view of curability of the layer for forming a to-be-plated layer, the content of the polymerization initiator is preferably 0.1 to 20 mass %, and more preferably 0.5 to 10 mass % with respect to 100 mass % of the compound having a polymerizable group in the to-be-plated layer forming composition.

If necessary, other additives (for example, organic solvent, sensitizer, curing agent, polymerization inhibitor, antioxidant, antistatic agent, filler, particles, flame retardant, lubricant, and plasticizer) may be added to the layer for forming a to-be-plated layer and the to-be-plated layer forming composition.

Particularly, in a case where an organic solvent is used, a hydrophilic solvent such as isopropanol and propylene glycol-1-monomethylether-2-acetate is preferable in view of the fact that the function of silicone-based surfactants and fluorine-based surfactants among the above-described surfactants is further exhibited.

<<Metal Layer Forming Step (Hereinafter, also Referred to as Step Y)>>

Figure 5A:
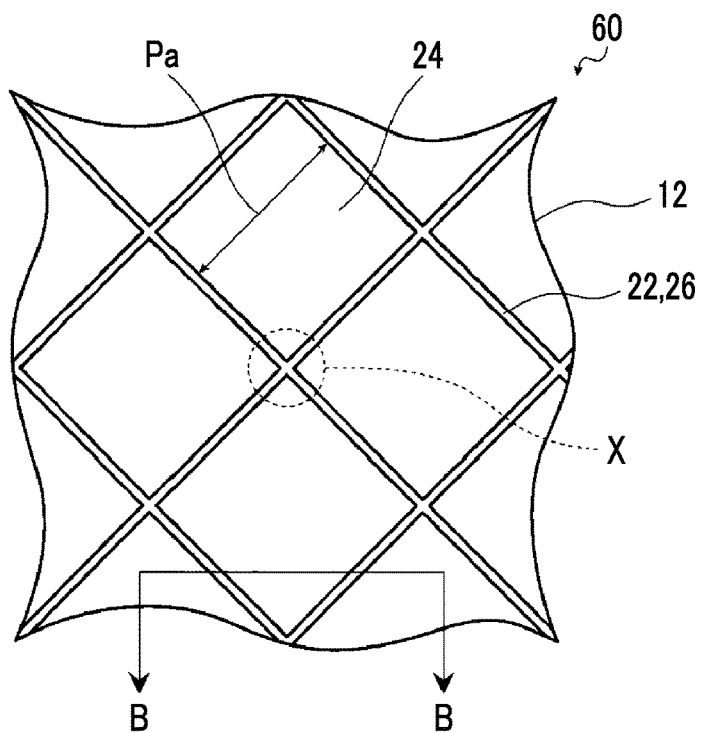
FIG. 5A is a top view of a conductive film.
Figure 5B:
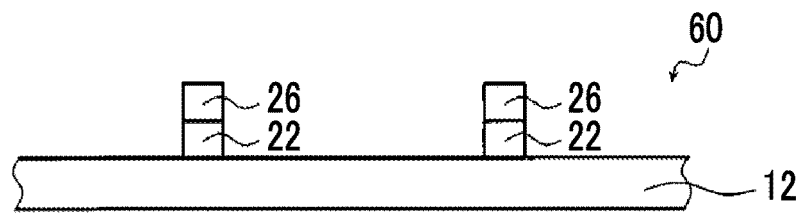
FIG. 5B is a sectional view taken along the line B-B of FIG. 5A.
Figure 5C:
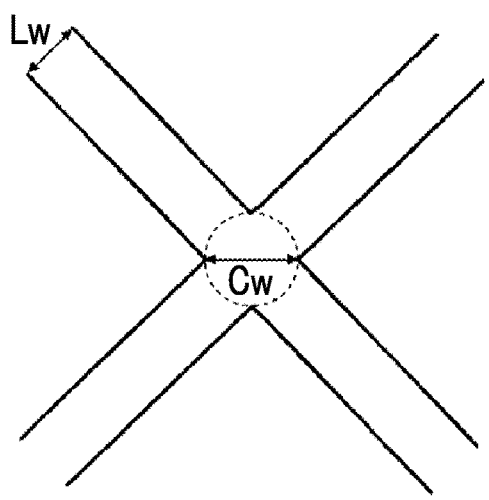
FIG. 5C is an enlarged top view of the region X of FIG. 5A, for illustrating an average intersection growing rate.
Figure 5D:
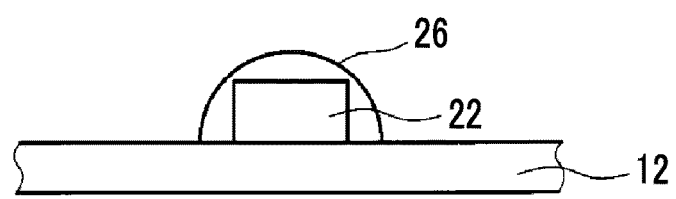
FIG. 5D illustrates an aspect of a metal thin wire.

The step Y is a step for forming a metal layer on the patterned to-be-plated layer. By performing this step, a metal layer (patterned metal layer) 26 is formed on the patterned to-be-plated layer 22 as illustrated in FIGS. 5A and 5B. The metal layer 26 has the same mesh shape as the patterned to-be-plated layer 22. FIG. 5A is a top view of a conductive film 60 obtained. FIG. 5B corresponds to the sectional view taken along the line B-B of FIG. 5A. The shape of the metal layer 26 (metal thin wires) is not limited to the shape illustrated in FIG. 5B, and as illustrated in FIG. 5D, the metal layer 26 may be disposed so as to cover the patterned to-be-plated layer 22 disposed on the substrate 12.

Hereinafter, first, a procedure of the step Y will be described in detail.

The step Y preferably has a step for applying a plating catalyst or a precursor thereof to the patterned to-be-plated layer (step Y1) and a step for performing a plating treatment on the patterned to-be-plated layer to which the plating catalyst or the precursor thereof has been applied (step Y2).

According to the procedure, the pattern of the metal layer can be controlled by controlling the shape of the patterned to-be-plated layer. In FIG. 5B, the metal layer 26 is formed only on an upper surface of the patterned to-be-plated layer 22, but the invention is not limited thereto. As described above, as illustrated in FIG. 5D, the metal layer may be formed on the upper surface and side surfaces (that is, entire surface of the patterned to-be-plated layer 22) of the patterned to-be-plated layer 22.

Hereinafter, the step Y1 and the step Y2 will be described in detail.

<Step Y1: Plating Catalyst Application Step>

In this step, first, a plating catalyst or a precursor thereof is applied to the patterned to-be-plated layer. In a case where the patterned to-be-plated layer contains the interactive group, the interactive group adheres to (absorbs) the plating catalyst or the precursor thereof which has been applied in accordance with the function thereof. Specifically, the plating catalyst or the precursor thereof is applied onto the surface of the patterned to-be-plated layer.

The plating catalyst or the precursor thereof functions as a catalyst and/or an electrode for the plating treatment. Therefore, the type of the plating catalyst or the precursor thereof to be used is appropriately determined in accordance with the type of the plating treatment.

The plating catalyst or the precursor thereof to be used is preferably an electroless plating catalyst or a precursor thereof. Hereinafter, an electroless plating catalyst or a precursor thereof will be mainly described in detail.

Any electroless plating catalyst can be used as long as it becomes an active nucleus during electroless plating. Specifically, a metal having a catalytic capacity of the autocatalytic reduction reaction (which is known as a metal capable of electroless plating with lower ionization tendency than Ni) may be used. Specific examples thereof include Pd, Ag, Cu, Ni, Pt, Au, and Co. Among them, Ag, Pd, Pt, or Cu is preferable in view of high catalytic capacity.

A metal colloid may be used as the electroless plating catalyst.

The electroless plating catalyst precursor can be used without any particular limitation as long as it may be converted into an electroless plating catalyst by a chemical reaction. Metal ions of the metals illustrated above for the electroless plating catalyst are mainly used. The metal ions which are the electroless plating catalyst precursors are converted by a reduction reaction into zero-valent metals which are the electroless plating catalysts. After the metal ion as the electroless plating catalyst precursor is applied to the patterned to-be-plated layer, the electroless plating catalyst precursor may be separately converted into a zero-valent metal by the reduction reaction before being immersed in an electroless plating liquid. Alternatively, the electroless plating catalyst precursor may be immersed in the electroless plating liquid to be converted into a metal (electroless plating catalyst) by the action of a reducing agent in the electroless plating liquid.

A metal salt is preferably used to apply the metal ion as the electroless plating catalyst precursor to the patterned to-be-plated layer. The metal salt to be used is not particularly limited as long as it dissolves in an appropriate solvent to be dissociated into a metal ion and a base (anion). Examples thereof include $M(NO_3)_n$, $MCl_n$, $M_{2/n}(SO_4)$, and $M_{3/n}(PO_4)$ (M represents an n-valent metal atom). The metal ion resulting from the dissociation of the metal salt can be preferably used. Examples thereof include Ag ion, Cu ion, Ni ion, Co ion, Pt ion, and Pd ion. Among these, ions capable of multidentate coordination are preferable, and Ag ion, Pd ion, and Cu ion are particularly preferable in view of the number of types of functional groups capable of coordination and the catalytic capacity.

In this step, a zero-valent metal may be used as a catalyst which is used for performing direct electroplating without electroless plating.

As a method for applying a plating catalyst or a precursor thereof to the patterned to-be-plated layer, for example, a solution of a plating catalyst or a precursor thereof dispersed or dissolved in an appropriate solvent may be prepared and applied to the patterned to-be-plated layer. Otherwise, the laminate having the patterned to-be-plated layer formed therein may be immersed in the solution.

Water and/or an organic solvent are appropriately used as the solvent. The organic solvent is preferably a solvent which can penetrate into the patterned to-be-plated layer.

The concentration of the plating catalyst or the precursor thereof in the solvent is not particularly limited, but preferably 0.001 to 50 mass %, and more preferably 0.005 to 30 mass %.

The contact time is preferably about 30 seconds to 24 hours, and more preferably about 1 minute to 1 hour.

<Step Y2: Plating Treatment Step>

Next, a plating treatment is performed on the patterned to-be-plated layer to which the plating catalyst or the precursor thereof has been applied.

The plating treatment method is not particularly limited, and examples thereof include an electroless plating treatment and an electrolytic plating treatment (electroplating treatment). In this step, an electroless plating treatment may be performed alone, or an electrolytic plating treatment may be further performed following an electroless plating treatment.

Hereinafter, a procedure of the electroless plating treatment and the electrolytic plating treatment will be described in detail.

The electroless plating treatment refers to an operation of precipitating metals through a chemical reaction using a solution of metal ions to be precipitated as plating dissolved therein.

For example, the electroless plating treatment in this step is preferably performed in such a manner that a laminate having the patterned to-be-plated layer to which an electroless plating catalyst has been applied is washed with water to remove an excess of the electroless plating catalyst (metal), and then immersed in an electroless plating liquid. As the electroless plating liquid to be used, a known electroless plating liquid can be used.

In a case where a substrate having the patterned to-be-plated layer to which an electroless plating catalyst precursor has been applied is immersed in an electroless plating liquid in a state of the electroless plating catalyst precursor being absorbed or impregnated in the patterned to-be-plated layer, it is preferable that the laminate is washed with water to remove an excess of the electroless plating catalyst precursor (such as a metal salt), and then immersed in an electroless plating liquid. In this case, the reduction of the electroless plating catalyst precursor and subsequent electroless plating are performed in the electroless plating liquid. Also with respect to the electroless plating liquid used herein, a known electroless plating liquid can be used in the same manner as described above.

Separately from the aspect in which an electroless plating liquid is used as described above, the reduction of an electroless plating catalyst precursor can also be performed with the preparation of a catalyst activating liquid (reducing liquid) as a separate step prior to the electroless plating.

A general composition of the electroless plating liquid mainly contains, in addition to the solvent (for example, water): 1. a metal ion for plating, 2. a reducing agent, and 3. an additive (stabilizer) enhancing the stability of metal ions. In addition to these ingredients, the electroless plating liquid may contain known additives such as a stabilizer for the plating liquid.

The organic solvent which can be used in the electroless plating liquid is preferably soluble in water, and in view of this, ketones such as acetone, and alcohols such as methanol, ethanol and, isopropanol are preferable. Copper, tin, lead, nickel, gold, silver, palladium, and rhodium are known as metal types which can be used in the electroless plating liquid. Among these, copper, silver, or gold is preferable, and copper is more preferable from the viewpoint of conductive property. The optimum reducing agent and additives are selected in accordance with the metal.

In this step, in a case where a plating catalyst or a precursor thereof which has been applied to the patterned to-be-plated layer functions as an electrode, electroplating can be performed on the patterned to-be-plated layer to which the catalyst or the precursor thereof has been applied.

As described above, in this step, if necessary, an electrolytic plating treatment can be performed after the electroless plating treatment. In such an aspect, the thickness of a metal layer to be formed can be appropriately adjusted.

Any known method can be used for electroplating. Examples of the metal which is used in the electroplating include copper, chromium, lead, nickel, gold, silver, tin, and zinc. From the viewpoint of conductive property, copper, gold, or silver is preferable, and copper is more preferable.

<<Conductive Film>>

A conductive film obtained through the above-described procedure has, as illustrated in FIG. 5A, the substrate 12, the patterned to-be-plated layer 22 which is disposed on the substrate 12 in a mesh pattern and has a functional group interacting with a plating catalyst or a precursor thereof, and the mesh-like metal layer 26 which is disposed on the patterned to-be-plated layer 22 and in which a plurality of metal thin wires intersect.

As illustrated in FIG. 5A, since the metal layer 26 is disposed on the mesh-like patterned to-be-plated layer 22, the metal layer 26 also has a mesh-like pattern (mesh pattern). In FIG. 5A, the metal layer in which four metal thin wires extend from one intersection is illustrated. However, the invention is not limited to this aspect, and three or five or more metal thin wires may extend from one intersection.

The average thickness of the patterned to-be-plated layer is 0.05 to 100 µm, and in view of further suppression of the visual recognition of the metal thin wires and/or more excellent conductive characteristics of the metal layer (hereinafter, also simply referred to as "in view of enhancing the effect of the invention"), the average thickness is preferably 0.07 to 10 µm, and more preferably 0.1 to 3 µm.

The average thickness of the patterned to-be-plated layer is an average value obtained by measuring thicknesses of ten arbitrary points with observation of a vertical section of the patterned to-be-plated layer using an electron microscope (for example, scanning electron microscope) and by then arithmetically averaging the thicknesses.

The wire width of the thin line portion of the mesh of the patterned to-be-plated layer is not particularly limited. However, in view of a balance between the conductive characteristics of the metal thin wires and difficulty in visual recognition, the wire width is preferably 30 µm or less, more preferably 15 µm or less, even more preferably 10 µm or less, and particularly preferably 5 µm or less. In addition, the wire width is preferably 0.5 µm or greater, and more preferably 1.0 µm or greater.

The patterned to-be-plated layer has a mesh shape, and in FIG. 5A, an opening 24 has a square shape. The opening may have another polygonal shape (for example, triangular shape, quadrangular shape, hexagonal shape, and random polygonal shape), and one side thereof may have a linear, curved, or circular arc shape. In a case where one side has a circular arc shape, for example, two sides opposed to each other may have a circular arc shape protruding outward, and other two sides opposed to each other may have a circular arc shape protruding inward. In addition, the shape of the respective sides may be like a wavy line in which circular arcs protruding outward and circular arcs protruding inward are continuously connected. The shape of the respective sides may be like a sine curve.

A length Pa of one side of the opening is not particularly limited, but preferably 1,500 µm or less, more preferably 1,300 µm or less, and even more preferably 1,000 µm or less. In addition, the length Pa is preferably 5 µm or greater, 30

µm or greater, and even more preferably 80 µm or greater. In a case where a length of a side of the opening is within the above range, it is possible to more excellently maintain the transparency of the conductive film, and in a case where the conductive film is attached to a front surface of a display device, it is possible to visually recognize the display without discomfort.

The average thickness of the metal layer is 0.05 to 0.5 µm, and in view of enhancing the effect of the invention, the average thickness is preferably 0.1 to 0.5 µm, and more preferably 0.3 to 0.5 µm.

The average thickness of the metal layer is an average value obtained by measuring thicknesses of ten arbitrary points with observation of a vertical section of the metal layer using an electron microscope (for example, scanning electron microscope) and by then arithmetically averaging the thicknesses.

The average wire width of the metal thin wires of the mesh of the metal layer is not particularly limited, but is 30 µm or less in many cases. In view of further suppression of the visual recognition of the metal thin wires, the average wire width is preferably 5 µm or less, and more preferably 3 µm or less. The lower limit is not particularly limited, but preferably 0.1 µm or greater.

The average wire width of the metal thin wires is an average value obtained by measuring a wire width of a metal thin wire between intersections of the mesh (preferably an intermediate position between intersections) at ten positions and by then arithmetically averaging the wire widths.

The average intersection growing rate at intersections of the metal thin wires of the mesh of the metal layer is 1.6 or less, and in view of further suppression of the visual recognition of the metal thin wires, the average intersection growing rate is preferably 1.5 or less, and more preferably 1.4 or less. The lower limit is not particularly limited, but may be 1.

Hereinafter, the average intersection growing rate will be described in detail using FIG. 5C. FIG. 5C is an enlarged top view of the region X (intersection) of FIG. 5A.

First, an intersection in a mesh refers to an intersection (intersection portion) at which metal thin wires which form the mesh intersect. In a case where the wire width of the metal thin wires at intersections is thicker than the average wire width of the metal thin wires of the mesh, it is said that the intersections are thick. The thickening degree of the intersections is called an "intersection growing rate" and is defined as follows.

Intersection Growing Rate=$Cw/(1.4142 \times Lw)$

Here, as illustrated in FIG. 5C, Cw represents, in a case where the conductive film is observed from the top using an electron microscope (for example, scanning electron microscope (SEM)) and a circle is drawn which is inscribed in an intersection of the metal thin wires which form the mesh, a diameter of the circle. In addition, Lw represents an average wire width of the metal thin wires which form the mesh. Lw is an average value obtained in a case where the wire width of the metal thin wire at an intermediate position between intersections is measured at ten positions as described above. Regarding the inscribed circle for obtaining Cw, the area thereof is as large as possible under a condition the inscribed circle has as many internal contacts as possible (two or more), and the inscribed circle does not protrude from the intersection region. An intersection growing rate corresponds to a value obtained by quantifying how much a diagonal of a square in an overlap portion in a case where two straight lines which form a mesh are perpendicular to each other and overlap each other without increase in the width of the two straight lines extends due to the thickening of the intersection. In a case where an intersection is not thick, the intersection growing rate is 1. In a case where an intersection is thick, the intersection growing rate is greater than 1, and in a case where an intersection is thin, the intersection growing rate is less than 1.

The average intersection growing rate is an average value obtained by calculating the intersection growing rate at 100 arbitrary intersections and by then arithmetically averaging the rates.

In the conductive film, the opening ratio is preferably 85% or greater, more preferably 90% or greater, and even more preferably 93% or greater in view of visible light transmittance. The opening ratio is a ratio of a part having no mesh-like metal layer in the entire film.

The metal layer may be further treated with a rust inhibitor. Through the treatment using a rust inhibitor, discoloration of the metal layer and an increase in the resistance are suppressed.

A blackened layer may be further disposed on the metal layer. By providing the blackened layer, an effect of reducing metallic luster of the metal layer and an effect of making a copper color inconspicuous in a case where the metal layer contains copper are obtained. In addition, a rustproof effect and a migration prevention effect are also obtained.

As a method for preparing the blackened layer (blackening method), a lamination method and a substitution method are used. Examples of the lamination method include a method for laminating a blackened layer using known blackening plating or the like, and NIKKA BLACK (manufactured by NIHON KAGAKU SANGYO CO., LTD.) or EBONY CHROMIUM 85 SERIES (manufactured by METAL FINISHING LABORATORY CO., LTD.) can be used. Furthermore, examples of the substitution method include a method for preparing a blackened layer by sulfurizing or oxidizing the surface of the metal layer and a method for preparing a blackened layer by substituting the surface of the metal layer with a nobler metal. As a sulfurization method, ENPLATE MB438A (manufactured by Meltex Inc.) is used, and as an oxidation method, PROBOND80 (manufactured by Rohm and Haas Electronic Materials LLC.) is used. In substitution plating with respect to a noble metal, palladium can be used.

The material of the blackened layer is not particularly limited, and examples thereof include known metals (for example, nickel).

(Use)

A conductive film according to the invention is applicable for various uses. For example, the conductive film is applicable for various uses such as touch panels (or touch panel sensors), semiconductor chips, various electric wiring boards, flexible printed circuits (FPC), chip on film (COF), tape automated bonding (TAB), antennas, multilayer printed circuit boards, and mother boards. The conductive film is preferably used in touch panel sensors (capacitive touch panel sensors). In a case where the conductive film is applied to a touch panel sensor, the metal layer in the conductive film functions as a detection electrode or lead-out wiring in the touch panel sensor. The metal layer may function as a so-called dummy pattern.

In this specification, a combination of a touch panel sensor and various display devices (for example, liquid crystal display device and organic electroluminescence display device) is called a touch panel. Preferable examples of the touch panel include a so-called capacitive touch panel.

EXAMPLES

Hereinafter, the invention will be described in more detail using examples. However, the invention is not limited thereto.

(Preparation of To-Be-Plated Layer Forming Composition 1 (Hereinafter, also Referred to as Composition 1))

A polyacrylic acid (manufactured by Wako Pure Chemical Industries, Ltd., weight average molecular weight: 8,000 to 12,000), a tetrafunctional acrylamide, a polymerization initiator, a fluorine-based surfactant (trade name "Irgacure 127", manufactured by BASF SE), and isopropanol were used to prepare a liquid in accordance with the composition of Table 1, and thus a composition 1 was obtained.

The tetrafunctional acrylamide is a compound represented by Formula (A). In Formula (A), R represents a hydrogen atom.

In Table 1, the content of each component is displayed in mass % with respect to a total amount of the composition.

TABLE 1

| Table 1 | Composition 1 |
|---|---|
| Polyacrylic Acid | 1.35 |
| Tetrafunctional Acrylamide | 0.9 |
| Polymerization Initiator | 0.045 |
| Fluorine-Based Surfactant | 0.015 |
| Isopropanol | 97.69 |

(A)

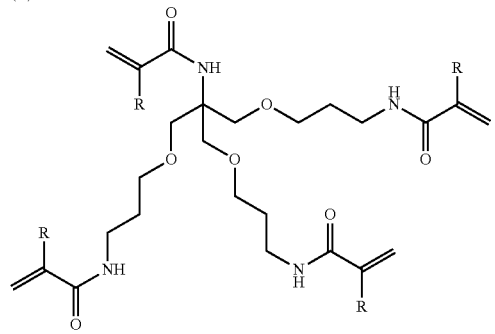

Example A1

On a substrate (trade name "LUMIRROR U48", polyethylene terephthalate film, long film, manufactured by TORAY INDUSTRIES, INC.), the composition 1 was applied by roll coating to form a film having a thickness of 600 nm, and the film was dried by an oven at 80° C. to form a layer for forming a to-be-plated layer on the substrate. The substrate having the layer for forming a to-be-plated layer formed thereon (substrate with layer for forming to-be-plated layer) was wound into a roll. No blocking was observed in a case where the substrate with a layer for forming a to-be-plated layer was wound.

Then, the roll was unwound to place the substrate with a layer for forming a to-be-plated layer in a vacuum chamber, and a photomask (hard mask) having openings with a thin-line mesh pattern having a line width of 3 µm and the layer for forming a to-be-plated layer were brought into close contact with each other in vacuum. Next, the layer for forming a to-be-plated layer was irradiated with light with a wavelength of 254 nm at an irradiation dose of 800 mJ/cm$^2$ using a parallel light exposure device while the vacuum state was maintained.

Thereafter, development was performed using a sodium carbonate aqueous solution to remove unexposed portions of the layer for forming a to-be-plated layer. Thus, a patterned to-be-plated layer consisting of exposed portions was formed, and a substrate having a patterned to-be-plated layer (substrate with patterned to-be-plated layer) was obtained.

In Example 1, using the photomask having openings with a thin-line mesh pattern having a line width of 3 µm, it was possible to form the thin lines (length Pa of one side of opening: 3 to 3.3 µm) of the patterned to-be-plated layer having a substantially rectangular cross-section and having a width of 3±0.1 µm as illustrated in FIG. 4. According to the manufacturing method of Example 1, it was possible to form a patterned to-be-plated layer having high accuracy. In addition, sticking of the layer for forming a to-be-plated layer to the photomask was not confirmed.

Then, the patterned to-be-plated layer of the substrate with a patterned to-be-plated layer was washed with water and immersed for 5 minutes in a Pd catalyst-imparting solution (manufactured by Rohm and Haas Company) at 30° C. Thereafter, the substrate with a patterned to-be-plated layer taken out of the Pd catalyst-imparting solution was washed with water. The substrate with a patterned to-be-plated layer washed with water was immersed in a metal catalyst reducing liquid (manufactured by Rohm and Haas Company) at 30° C.

Then, the substrate with a patterned to-be-plated layer taken out of the metal catalyst reducing liquid was washed with water. The substrate with a patterned to-be-plated layer washed with water was immersed for 3 minutes in a copper plating liquid (manufactured by Rohm and Haas Company) at 30° C. As a result, a conductive film having metal wires in which the entire patterned to-be-plated layer was covered by copper plating was obtained. The metal layer (wiring pattern) formed by the metal wires had a mesh shape similarly to the patterned to-be-plated layer, and the resistance value thereof was low. Adhesiveness between the wiring pattern and the to-be-plated layer was excellent.

Example A2

A conductive film was manufactured according to the same procedure as Example A1, except that a to-be-plated layer forming composition 2 prepared according to the following procedure was used in place of the composition 1.

Synthesis Example 1: Polymer 1

1 L of ethyl acetate and 159 g of 2-aminoethanol were put into a 2-L three-necked flask and cooled in an ice bath. 150 g of 2-bromoisobutyric acid bromide was added dropwise thereto while the temperature in the flask was adjusted to 20° C. or lower. Then, the temperature in the flask was increased to room temperature (25° C.) to cause a reaction for 2 hours. After the reaction was finished, 300 mL of distilled water was added to the three-necked flask to stop the reaction. Then, the ethyl acetate phase in the three-necked flask was taken out, washed 4 times with 300 mL of distilled water, and then dried with magnesium sulfate. Further, the ethyl acetate was distilled off to obtain 80 g of a war material A.

Next, 47.4 g of the raw material A, 22 g of pyridine, and 150 mL of ethyl acetate were put into a 500-mL three-necked flask and cooled in an ice bath. 25 g of acrylic acid chloride was added dropwise thereto while the temperature in the flask was adjusted to 20° C. or lower. Then, the temperature in the flask was increased to room temperature to cause a reaction for 3 hours. After the reaction was finished, 300 mL of distilled water was added to the three-necked flask to stop the reaction. Then, the ethyl acetate phase in the three-necked flask was taken out, washed 4 times with 300 mL of distilled water, and then dried with magnesium sulfate. Further, the ethyl acetate was distilled off to obtain solid matter. Thereafter, the solid matter was purified by column chromatography, and the following monomer M1 (20 g) was obtained.

Monomer M1

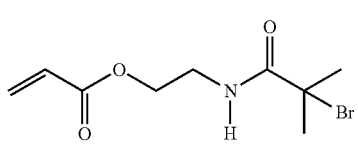

8 g of N,N-dimethylacetamide was put into a 500-mL three-necked flask and heated to 65° C. in a nitrogen gas stream. A solution containing 8 g of N,N-dimethylacetamide with 14.3 g of the monomer M1, 3.0 g of acrylonitrile (manufactured by Tokyo Chemical Industry Co., Ltd.), 6.5 g of acrylic acid (manufactured by Tokyo Chemical Industry Co., Ltd.), and 0.4 g of V-65 (manufactured by Wako Pure chemical Industries, Ltd.) was added dropwise thereto for 4 hours.

After the dropwise addition was finished, the reaction solution was stirred for 3 hours. Thereafter, 41 g of N,N-dimethylacetamide was added to the reaction solution and the reaction solution was cooled to room temperature. 0.09 g of 4-hydroxy TEMPO (manufactured by Tokyo Chemical Industry Co., Ltd.) and 54.8 g of diazabicycloundecene (DBU) were added to the reaction solution to cause a reaction at room temperature for 12 hours. Subsequently, 54 g of a 70 mass % methanesulfonic acid aqueous solution was added to the reaction solution. After the reaction was finished, re-precipitation was performed with water, and solid matter was extracted, thereby obtaining 12 g of a polymer 1.

The obtained polymer 1 was identified using an infrared light (IR) measuring machine (manufactured by Horiba, Ltd.). The polymer 1 was dissolved in acetone and KBr crystals were used to perform the measurement. As the result of the IR measurement, it was found that a peak was observed in the vicinity of 2,240 cm$^{-1}$ and acrylonitrile serving as a nitrile unit was introduced into the polymer 1. Further, as a result of the acid value measurement, it was found that acrylic acid was introduced as a carboxylic acid unit. In addition, the acrylic acid was dissolved in heavy dimethyl sulfoxide (DMSO) and the measurement was performed using $^1$H NMR (AV-300) of 300 MHz (manufactured by Bruker Corporation). A peak corresponding to the nitrile group-containing unit was broadly observed at 2.5 to 0.7 ppm (5H), a peak corresponding to the polymerizable group-containing unit was broadly observed at 7.8 to 8.1 ppm (1H), 5.8 to 5.6 ppm (1H), 5.4 to 5.2 ppm (1H), 4.2 to 3.9 ppm (2H), 3.3 to 3.5 ppm (2H), and 2.5 to 0.7 ppm (6H), and a peak corresponding to the carboxylic acid-containing unit was broadly observed at 2.5 to 0.7 ppm (3H). It was found that the ratio of the polymerizable group-containing unit:the nitrile group-containing unit:the carboxylic acid group unit was 30:30:40 (mol %).

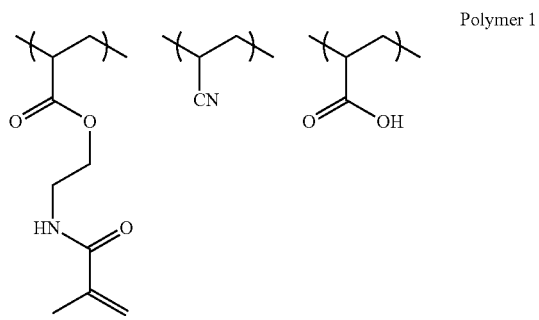

Polymer 1

(Preparation of To-Be-Plated Layer Forming Composition 2)

5.142 g of water, 67.110 g of propylene glycol monomethyl ether, 0.153 g of 2-acrylamide-2-methylpropanesulfonic acid, 17.034 g of the polymer 1, 0.279 g of hexamethylenebisacrylamide, and 0.279 g of IRGACURE OXE127 (BASF) were added to a 200-ml beaker including a magnetic stirrer therein to prepare a liquid, and a to-be-plated layer forming composition 2 was obtained.

Comparative Example A1

A conductive film was manufactured according to the same procedure as Example A1, except that the exposure was performed in a state in which the photomask and the layer for forming a to-be-plated layer were brought into close contact with each other in the atmosphere, not under vacuum.

Example B1, Comparative Examples A2 to A4, and Comparative Example B2

In Example B1, Comparative Examples A2 to A4, and Comparative Example B2, conductive films were manufactured by changing the conditions of the treatments performed in Example A1, such that the average thicknesses of a patterned to-be-plated layer, the average thicknesses of a metal layer, the wire width of metal thin wires, and the average intersection growing rate were as shown in Table 2 to be described later.

<Various Evaluations>

The following evaluations were performed using the conductive films obtained in the examples and the comparative examples.

(Measurement of Average Intersection Growing Rate)

The conductive films obtained in the examples and the comparative examples were observed and imaged using a scanning electron microscope (manufactured by Hitachi High-Technologies Corporation, S3000N), and average intersection growing rates were calculated in accordance with the above-described definition.

(Visibility Evaluation)

The conductive films obtained in the examples and the comparative examples were visually observed to perform the evaluation in accordance with the following standards.

"A": it was not possible to confirm metal thin wires.

"B": black metal thin wires were visually confirmed slightly. However, there is no problem in practical use.

"C": metal thin wires were visually confirmed, or metallic-colored metal thin wires constituting metal thin wires were visually confirmed. Accordingly, there is a problem in practical use.

(Conductive Property Evaluation)

The measurement was performed on the metal layers of the conductive films obtained in the examples and the comparative examples using LORESTA GP MCP-T610 manufactured by Mitsubishi Chemical Analytech Co., Ltd. A case where conduction can be confirmed is represented by "A", and a case where no conduction can be confirmed is represented by "B".

In Table 2, in the column of "mask setting method", "vacuum contact" means that the exposure was performed in a state in which the layer for forming a to-be-plated layer and the photomask were brought into contact with each other under vacuum, and "stationary" means that the exposure was performed in a state in which the layer for forming a to-be-plated layer and the photomask were brought into contact with each other in the atmosphere.

In Table 2, "wire width" means an average width of the metal thin wires.

TABLE 2

| | Composition Type | Mask Setting Method | Average Thickness of Patterned To-Be-Plated Layer (μm) | Average Thickness of Metal Layer (μm) | Wire Width (μm) | Average Intersection Growing Rate | Visibility Evaluation | Conductive Property Evaluation |
|---|---|---|---|---|---|---|---|---|
| Example A1 | Composition 1 | Vacuum Contact | 0.4 | 0.5 | 5 | 1.6 | A | A |
| Example A2 | Composition 2 | Vacuum Contact | 0.8 | 0.4 | 5 | 1.5 | A | A |
| Comparative Example A1 | Composition 1 | Stationary | 0.4 | 0.5 | 5.5 | 3.0 | C | A |
| Comparative Example A2 | Composition 1 | Vacuum Contact | 0.4 | 1.0 | 5.3 | 2.5 | C | A |
| Comparative Example A3 | Composition 1 | Vacuum Contact | 0.4 | 0.04 | 4 | 1.2 | A | B |
| Comparative Example A4 | Composition 1 | Vacuum Contact | 0.04 | 0.4 | 5 | 1.4 | C | A |
| Example B1 | Composition 1 | Vacuum Contact | 0.4 | 0.5 | 20 | 1.4 | B | A |
| Comparative Example B1 | Composition 1 | Vacuum Contact | 0.4 | 1.0 | 20 | 2.0 | C | A |

As shown in Table 2, it was confirmed that in cases of the conductive films according to the invention, it was hard to visually recognize the metal thin wires, and the conductive property was excellent.

However, in the comparative examples not satisfying the predetermined conditions, no desired effect was obtained.

EXPLANATION OF REFERENCES

12: substrate
14: layer for forming to-be-plated layer
16: photomask
16a: opening
18: exposed portion
20: unexposed portion
22: patterned to-be-plated layer
24: opening
26: metal layer
50: substrate with patterned to-be-plated layer
60: conductive film
100, 104: metal thin wire
102, 106: intersection

What is claimed is:

1. A conductive film comprising:

a substrate;

a patterned to-be-plated layer which is disposed on the substrate in a mesh pattern and has a functional group interacting with a plating catalyst or a precursor thereof; and a mesh-like metal layer which is disposed on the patterned to-be-plated layer and has a plurality of metal thin wires intersecting each other, wherein an average thickness of the patterned to-be-plated layer is 0.05 to 100 μm, an average thickness of the metal layer is 0.05 to 0.5 μm, and an average intersection growing rate at an intersection of metal thin wires of the mesh of the metal layer is 1.6 or less, Average Intersection Growing Rate: an average value obtained by calculating an intersection growing rate at 100 intersections of the metal thin wires and by then arithmetically averaging the rates, wherein Intersection Growing Rate=$Cw/(1.4142 \times Lw)$ where $Cw$ represents, in a case where a circle is drawn which is inscribed in an intersection of the metal thin wires, a diameter of the circle, and $Lw$ represents an average wire width of the metal thin wires.

2. The conductive film according to claim 1, wherein the average wire width of the metal thin wires is 5 μm or less.

3. The conductive film according to claim 1, wherein the patterned to-be-plated layer is formed in such a manner that a layer for forming a to-be-plated layer containing the following compound X or composition Y is formed on the substrate and brought into close contact with a photomask under vacuum, and an exposure treatment is performed on the layer for forming a to-be-plated layer in a mesh pattern wherein compound X: a compound having a functional group interacting with a plating catalyst or a precursor thereof, and a polymerizable group, and composition Y: a composition including a compound having a functional group interacting with a plating catalyst or a precursor thereof, and a compound having a polymerizable group.

4. The conductive film according to claim 1,
wherein the metal layer is formed in such a manner that a plating catalyst or a precursor thereof is applied to the patterned to-be-plated layer, and a plating treatment is performed on the patterned to-be-plated layer to which the plating catalyst or the precursor thereof has been applied.

5. A touch panel sensor comprising:
the conductive film according to claim 1.

6. A touch panel comprising:
the conductive film according to claim 1.

7. The conductive film according to claim 2,
wherein the patterned to-be-plated layer is formed in such a manner that a layer for forming a to-be-plated layer containing the following compound X or composition Y is formed on the substrate and brought into close contact with a photomask under vacuum, and an exposure treatment is performed on the layer for forming a to-be-plated layer in a mesh pattern wherein compound X: a compound having a functional group interacting with a plating catalyst or a precursor thereof, and a polymerizable group, and composition Y: a composition including a compound having a functional group interacting with a plating catalyst or a precursor thereof, and a compound having a polymerizable group.

8. The conductive film according to claim 2,
wherein the metal layer is formed in such a manner that a plating catalyst or a precursor thereof is applied to the patterned to-be-plated layer, and a plating treatment is performed on the patterned to-be-plated layer to which the plating catalyst or the precursor thereof has been applied.

9. The conductive film according to claim 3,
wherein the metal layer is formed in such a manner that a plating catalyst or a precursor thereof is applied to the patterned to-be-plated layer, and a plating treatment is performed on the patterned to-be-plated layer to which the plating catalyst or the precursor thereof has been applied.

10. A touch panel sensor comprising:
the conductive film according to claim 2.

11. A touch panel sensor comprising:
the conductive film according to claim 3.

12. A touch panel sensor comprising:
the conductive film according to claim 4.

13. A touch panel comprising:
the conductive film according to claim 2.

14. A touch panel comprising:
the conductive film according to claim 3.

15. A touch panel comprising:
the conductive film according to claim 4.

* * * * *